US006960771B1

(12) United States Patent
Suyama et al.

(10) Patent No.: US 6,960,771 B1
(45) Date of Patent: Nov. 1, 2005

(54) OPTICAL MEASUREMENT APPARATUS AND METHOD FOR OPTICAL MEASUREMENT

(75) Inventors: Motohiro Suyama, Hamamatsu (JP); Yoshihiko Kawai, Hamamatsu (JP); Tetsuya Morita, Hamamatsu (JP); Koichiro Oba, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 335 days.

(21) Appl. No.: 10/381,368

(22) PCT Filed: Sep. 25, 2000

(86) PCT No.: PCT/JP00/06561

§ 371 (c)(1),
(2), (4) Date: Mar. 25, 2003

(87) PCT Pub. No.: WO02/27283

PCT Pub. Date: Apr. 4, 2002

(30) Foreign Application Priority Data

Mar. 26, 1999 (JP) ............................. 11-83839

(51) Int. Cl.[7] ................................ G01T 1/42
(52) U.S. Cl. ................................ 250/363.01
(58) Field of Search ........................ 250/363.01, 573, 250/574; 702/28

(56) References Cited

U.S. PATENT DOCUMENTS 5,866,907 A * 2/1999 Drukier et al. ............. 250/366

FOREIGN PATENT DOCUMENTS

| EP | 0953837 | 11/1999 |
|---|---|---|
| JP | A 4-184291 | 7/1992 |
| JP | A 5-072113 | 3/1993 |
| JP | A 6-318447 | 11/1994 |
| JP | A 7-167709 | 7/1995 |
| JP | A 8-148113 | 6/1996 |
| JP | A 9-178852 | 7/1997 |
| JP | A 9-196752 | 7/1997 |
| JP | A 9-297055 | 11/1997 |
| JP | A 9-312145 | 12/1997 |
| JP | A 9-329548 | 12/1997 |
| JP | A 10-227695 | 8/1998 |
| JP | A 10-512087 | 11/1998 |
| JP | A 11-37850 | 2/1999 |
| JP | A 11-37851 | 2/1999 |
| JP | A 2000-275102 | 10/2000 |

OTHER PUBLICATIONS

U.S. Appl. No. 10/381,370, filed Mar. 25, 2003, Suyama et al.
Yamashita et al., "Utilization of High–Gain First Dynode PMTs for Measuring the Average Numbers of Photoelectrons in Weak Light and Scintillations", Electrotechnical Laboratory, 1998, pp 116–128.

* cited by examiner

Primary Examiner—David Porta
Assistant Examiner—Marcus Taningco
(74) Attorney, Agent, or Firm—Oliff & Berridge, PLC

(57) ABSTRACT

A liquid scintillation counter 10 serving as an optical measurement apparatus includes: an HPD 24, a charge amplifier 26, a voltage amplifier 28, a comparator 30, a counter 32, a multi-channel analyzer 34, a display 38, and the like. The HPD 24 has a photocathode 24a and an APD 24b for outputting a signal that corresponds to the number of incident photons. The comparator 30 outputs a logic pulse signal, serving as a comparison result signal, only when the signal outputted from the HPD 24 and amplified by the charge amplifier 26 and voltage amplifier 28 is larger than a prescribed threshold value. This threshold value is set larger than an output signal that is outputted when a single photoelectron is emitted from the photocathode 24a and smaller than another output signal that is outputted when two or more photoelectrons are emitted.

29 Claims, 6 Drawing Sheets

OPTICAL MEASUREMENT APPARATUS AND METHOD FOR OPTICAL MEASUREMENT

TECHNICAL FIELD

The present invention relates to an optical measurement apparatus such as a scintillation counter, particle counter, and the like, and a method for optical measurement such as a method of scintillation counting, a method of particle counting, and the like.

BACKGROUND ART

For example, an optical measurement apparatus employing a photomultiplier tube is well known in the art for measuring weak light, such as fluorescent light emitted from a scintillator. The photomultiplier tube includes a photocathode that emits photoelectrons that correspond to the amount of light of an incident beam, and a multiplying unit for amplifying and outputting the photoelectrons emitted from the photocathode. Accordingly, the amount of light of the incident beam can be measured by counting the number of pulse currents outputted from the photomultiplier tube.

However, when this optical measurement apparatus is used to perform high-precision measurements, dark current pulses emitted due to thermal fluctuations and the like, act as noise. One technique for overcoming such a problem is a method of simultaneous measurement employing two photomultiplier tubes, wherein the output pulse is deamed effective only when the same output pulse is obtained from both photomultiplier tubes.

However, the following problems have been associated with optical measurement apparatuses that eliminate dark current pulses using the method of simultaneous measurement. First, the apparatus is complex to manufacture and large in size, since it requires two photomultiplier tubes, two high-speed processing circuits, and simultaneous counting circuits. Further, counting efficiency, or precision, drops because photons must be impinged simultaneously on both photomultiplier tubes.

Another technique and the like for detecting multiple photons simultaneously are well known in the art. In this technique, the output pulse is considered as valid only when the peak value of the output pulse is greater than or equal to a specified threshold value. However, the following problems are associated with optical measurement apparatuses that eliminate dark current pulses by providing such a threshold value. As described by Mikio Yamashita, Osamu Yura, and Yasushi Kawada in "Utilization of High-Gain First-Dynode PMTs for Measuring the Average Numbers of Photoelectrons in Weak Light and Scintillations" (Bulletin of the Electrotechnical Laboratory, Vol. 47, Nos. 9 and 10, 1988), for example, dark current pulses have nearly identical output waveforms with that of an output pulse that is generated when a single photoelectron is emitted from the photocathode. However, it is impossible to completely separate, based on output waveforms from the photomultiplier tube, an event in which a single photoelectron is emitted from the photocathode from another event in which a plurality of photoelectrons are emitted. It is necessary to set a large threshold value (for example, a value equivalent to a peak value of an output pulse for four photoelectrons) in order to eliminate dark current pulses. Hence, by setting a large threshold value, it is possible to effectively eliminate dark current pulses, but more photoelectrons will pass through uncounted, resulting in a drop in counting efficiency or a drop in precision.

In order to overcome this problem, optical measurement apparatuses, capable of separately detecting an event in which a single photoelectron is emitted and another event in which multiple photoelectrons are emitted, have been disclosed, for example, in Japanese unexamined patent application publications Nos. HEI-9-196752, HEI-9-329548, and HEI-10-227695. However, the optical measurement apparatuses disclosed therein estimate the average number of photoelectrons and the like, but are incapable of eliminating dark current pulses.

DISCLOSURE OF THE INVENTION

In view of the foregoing, it is an object of the present invention to provide an optical measurement apparatus and a method for optical measurement which is capable of eliminating dark current pulses effectively and which is capable of measuring light with high precision.

In order to overcome the above-described problem, the present invention provides an optical measurement apparatus comprising: a photodetecting portion emitting photoelectrons that correspond to the amount of light in an incident light beam and outputting an output signal that corresponds to the number of the photoelectrons; a comparing portion comparing the output signal with a predetermined threshold value and outputting a comparison result signal when the output signal is greater than the threshold value, the comparing portion outputting no comparison result signal when the output signal is not greater than the threshold value; and a measuring portion performing measurement in accordance with the comparison result signal, wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons, whereby the measuring portion performs measurement when the photodetecting portion emits two or more photoelectrons, the measuring portion failing to perform measurement when the photodetecting portion emits only one photoelectron.

According to the optical measurement apparatus of the present invention, the photodetecting portion outputs an output signal corresponding to the number of the photoelectrons. The apparatus outputs a comparison result signal only when the output signal is larger than the threshold value, which is larger than an output signal that is outputted when a single photoelectron is emitted and which is smaller than another output signal that is outputted when two photoelectrons are emitted. Accordingly, it is possible to effectively eliminate dark current pulses having an output waveform nearly identical with that of the output pulse that is outputted when a single photoelectron is emitted. Another output signal that is outputted when two or more photoelectrons are emitted is not eliminated, but a comparison result signal is effectively outputted. As a result, the optical measurement apparatus can perform measurements with high precision.

It is preferable that the optical measurement apparatus of the present invention further comprises a setting portion setting the threshold value.

It is noted that an output signal of a dark current pulse or an output signal that is outputted when a single photoelectron is emitted fluctuates due to the ambient temperature and other aspects of the working environment. By providing the setting portion that sets the threshold value, it is possible to appropriately reset the threshold value according to the working environment. As a result, the optical measurement apparatus can perform measurements with high precision regardless of the working environment.

It is preferable that the setting portion measures an output signal that the photodetecting portion outputs when the photodetecting portion outputs a single photoelectron, the setting portion setting the threshold value within a range of the amount of the output signal and two times the amount of the output signal.

By measuring the output signal that is outputted when a single photoelectron is emitted and by setting the threshold to a value between one and two times the output signal, it is possible to establish an appropriate threshold value even if the output signal outputted when a single photoelectron is emitted is not previously known. As a result, the optical measurement apparatus can perform measurements with high precision even when the output signal for a single emitted photoelectron is not previously known.

It is preferable that the setting portion measures, for a fixed period of time, output signals that the photodetecting portion outputs when the photodetecting portion detects no beam of light in a dark state, the setting portion setting the threshold value to a maximum value of the output signals measured during the fixed period of time.

By measuring output signals in a dark state for the fixed period of time and by setting the maximum value of the measured output signals as the threshold value, it is possible to set an appropriate threshold value even if the output signals in a dark state are not previously known. As a result, the optical measurement apparatus can perform measurements with high precision even when the output signal in a dark state are not previously known.

It is preferable that the threshold value has a value within a range of 1.2 to 1.8 times an output signal that the photodetecting portion outputs when the photodetecting portion emits a single photoelectron. It is more preferable that the threshold value has a value within a range of 1.3 to 1.5 times an output signal that the photodetecting portion outputs when the photodetecting portion emits a single photoelectron.

It is preferable that the photodetecting portion includes: a photocathode emitting photoelectrons that correspond to the amount of light in the incident light beam; an accelerating portion accelerating the photoelectrons emitted from the photocathode; and a semiconductor photodetector receiving the photoelectrons accelerated by the accelerating portion and outputting a signal that corresponds to the number of the photoelectrons.

By employing the photodetecting portion that is provided with the photocathode, the accelerating portion, and the semiconductor photodetector, it is possible to effectively detect separately the event, in which a single photoelectron is emitted from the photocathode and the other event, in which two or more photoelectrons are emitted from the photocathode simultaneously (or at extremely close timings). As a result, the optical measurement apparatus can perform measurements with extremely high efficiency.

It is preferable that the semiconductor photodetector includes an avalanche photodiode.

According to another aspect, the present invention provides a scintillation counter, comprising: a scintillator converting beta rays emitted from an object of measurement into fluorescent light; a photodetecting portion receiving the fluorescent light, and emitting photoelectrons that correspond to the amount of the fluorescent light, thereby outputting an output signal that corresponds to the number of the photoelectrons; a comparing portion comparing the output signal with a predetermined threshold value and outputting a comparison result signal when the output signal is greater than the threshold value, the comparing portion outputting no comparison result signal when the output signal is not greater than the threshold value; and a measuring portion counting the fluorescent light in accordance with the comparison result signal, wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons, whereby the measuring portion performs counting when the photodetecting portion emits two or more photoelectrons, the measuring portion failing to perform counting when the photodetecting portion emits only one photoelectron.

The scintillation counter of the present invention not only can effectively eliminate dark current pulses, but also can effectively output a comparison result signal without eliminating such an output signal that is outputted when two or more photoelectrons are emitted. As a result, it is possible to count scintillation with high precision.

According to still another aspect, the present invention provides a particle counter, comprising: a scattered light generating portion generating scattered light by scattering light according to particles mixed in a sample to be measured; a photodetecting portion receiving the scattered light, and emitting photoelectrons that correspond to the amount of the scattered light, thereby outputting an output signal that corresponds to the number of the photoelectrons; a comparing portion comparing the output signal with a predetermined threshold value and outputting a comparison result signal when the output signal is greater than the threshold value, the comparing portion outputting no comparison result signal when the output signal is not greater than the threshold value; and a measuring portion counting the particles in accordance with the comparison result signal, wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons, whereby the measuring portion performs counting when the photodetecting portion emits two or more photoelectrons, the measuring portion failing to perform counting when the photodetecting portion emits only one photoelectron.

The particle counter of the present invention not only can effectively eliminate dark current pulses, but also can effectively output a comparison result signal without eliminating such an output signal that is outputted when two or more photoelectrons are emitted. As a result, it is possible to count particles with high precision.

In order to overcome the above-described problem, the present invention provides an optical measurement method comprising: a photodetecting step emitting photoelectrons that correspond to the amount of light in an incident light beam and outputting an output signal that corresponds to the number of the photoelectrons; a comparing step comparing the output signal with a predetermined threshold value and outputting a comparison result signal when the output signal is greater than the threshold value, the comparing step outputting no comparison result signal when the output signal is not greater than the threshold value; and a measuring step performing measurement in accordance with the comparison result signal, wherein the threshold value is larger than an output signal that the photodetecting step outputs when the photodetecting step emits only one photoelectron, the threshold value being smaller than another output signal that the photodetecting step outputs when the photodetecting step emits two photoelectrons, whereby the measuring step performs measurement when the photodetecting step emits two or more photoelectrons, the measuring step failing toe perform measurement when the photodetecting step emits only one photoelectron.

According to the optical measurement method of the present invention, the photodetecting step outputs an output signal corresponding to the number of the photoelectrons. A comparison result signal is outputted only when the output signal is larger than the threshold value, which is larger than an output signal that is outputted when a single photoelectron is emitted and which is smaller than another output signal that is outputted when two photoelectrons are emitted. Accordingly, it is possible to effectively eliminate dark current pulses having an output waveform nearly identical with that of the output pulses that is outputted when a single photoelectron is emitted. Another output signal that is outputted when two or more photoelectrons are emitted is not eliminated, but a comparison result signal is effectively outputted. As a result, the optical measurement method can perform measurements with high precision.

It is preferable that the optical measurement method of the present invention further comprises a setting step setting the threshold value.

It is noted that an output signal of a dark current pulse or an output signal that is outputted when a single photoelectron is emitted fluctuates due to the ambient temperature and other aspects of the working environment. By providing the setting step that sets the threshold value, it is possible to appropriately reset the threshold value according to the working environment. As a result, the optical measurement method can perform measurements with high precision regardless of the working environment.

It is preferable that the setting step measures an output signal that the photodetecting step outputs when the photodetecting step outputs a single photoelectron, the setting step setting the threshold value within a range of the amount of the output signal and two times the amount of the output signal.

By measuring the output signal that is outputted when a single photoelectron is emitted and by setting the threshold to a value between one and two times the output signal, it is possible to establish an appropriate threshold value even if the output signal outputted when a single photoelectron is emitted is not previously known. As a result, the optical measurement method can perform measurements with high precision even when the output signal for a single emitted photoelectron is not previously known.

It is preferable that the setting step measures, for a fixed period of time, output signals that the photodetecting step outputs when the photodetecting step detects no beam of light in a dark state, the setting step setting the threshold value to a maximum value of the output signals measured during the fixed period of time.

By measuring output signals in a dark state for the fixed period of time and by setting the maximum value of the measured output signals as the threshold value, it is possible to set an appropriate threshold value even if the output signals in a dark state are not previously known. As a result, the optical measurement method can perform measurements with high precision even when the output signal in a dark state are not previously known.

It is preferable that the threshold value has a value within a range of 1.2 to 1.8 times an output signal that the photodetecting step outputs when the photodetecting step emits a single photoelectron. It is more preferable that the threshold value has a value within a range of 1.3 to 1.5 times an output signal that the photodetecting step outputs when the photodetecting step emits a single photoelectron.

According to another aspect, the present invention provides a scintillation counting method, comprising: a fluorescent converting step using a scintillator to convert beta rays emitted from an object of measurement into fluorescent light; a photodetecting step receiving the fluorescent light, and emitting photoelectrons that correspond to the amount of the fluorescent light, thereby outputting an output signal that corresponds to the number of the photoelectrons; a comparing step comparing the output signal with a predetermined threshold value and outputting a comparison result signal when the output signal is greater than the threshold value, the comparing step outputting no comparison result signal when the output signal is not greater than the threshold value; and a measuring step counting the fluorescent light in accordance with the comparison result signal; wherein the threshold value is larger than an output signal that the photodetecting step outputs when the photodetecting step emits only one photoelectron, the threshold value being smaller than another output signal that the photodetecting step outputs when the photodetecting step emits two photoelectrons, whereby the measuring step performs counting when the photodetecting step emits two photoelectrons, the measuring step failing to perform counting when the photodetecting step emits only one photoelectron.

The scintillation counting method of the present invention not only can effectively eliminate dark current pulses, but also can effectively output a comparison result signal without eliminating such an output signal that is outputted when two or more photoelectrons are emitted. As a result, it is possible to count scintillation with high precision.

According to still another aspect, the present invention provides a particle counting method, comprising: a scattered light generating stop generating scattered light by scattering light according to particles mixed in a sample to be measured; a photodetecting step receiving the scattered light, and emitting photoelectrons that correspond to the amount of the scattered light, thereby outputting an output signal that corresponds to the number of the photoelectrons; a comparing step comparing the output signal with a predetermined threshold value and outputting a comparison result signal when the output signal is greater than the threshold value, the comparing step outputting no comparison result signal when the output signal is not greater than the threshold value; and a measuring step counting the particles in accordance with the comparison result signal, wherein the threshold value is larger than an output signal that the photodetecting step outputs when the photodetecting step emits only one photoelectron, the threshold value being smaller than another output signal that the photodetecting step outputs when the photodetecting step emits two photoelectrons, whereby the measuring step performs counting when the photodetecting step emits two or more photoelectrons, the measuring step failing to perform counting when the photodetecting step emits only one photoelectron.

The particle counting method of the present invention not only can effectively eliminate dark current pulses, but also can effectively output a comparison result signal without eliminating such an output signal that is outputted when two or more photoelectrons are emitted. As a result, it is possible to count particles with high precision.

BEST MODE FOR CARRYING OUT THE INVENTION

An optical measurement apparatus according to preferred embodiments of the present invention will be described while referring to FIGS. 1–7.

First, an optical measurement apparatus according to a first embodiment of the present invention will be described with reference to FIGS. 1–5. The optical measurement apparatus according to the present embodiment is a liquid scintillation counter.

Figure 1:
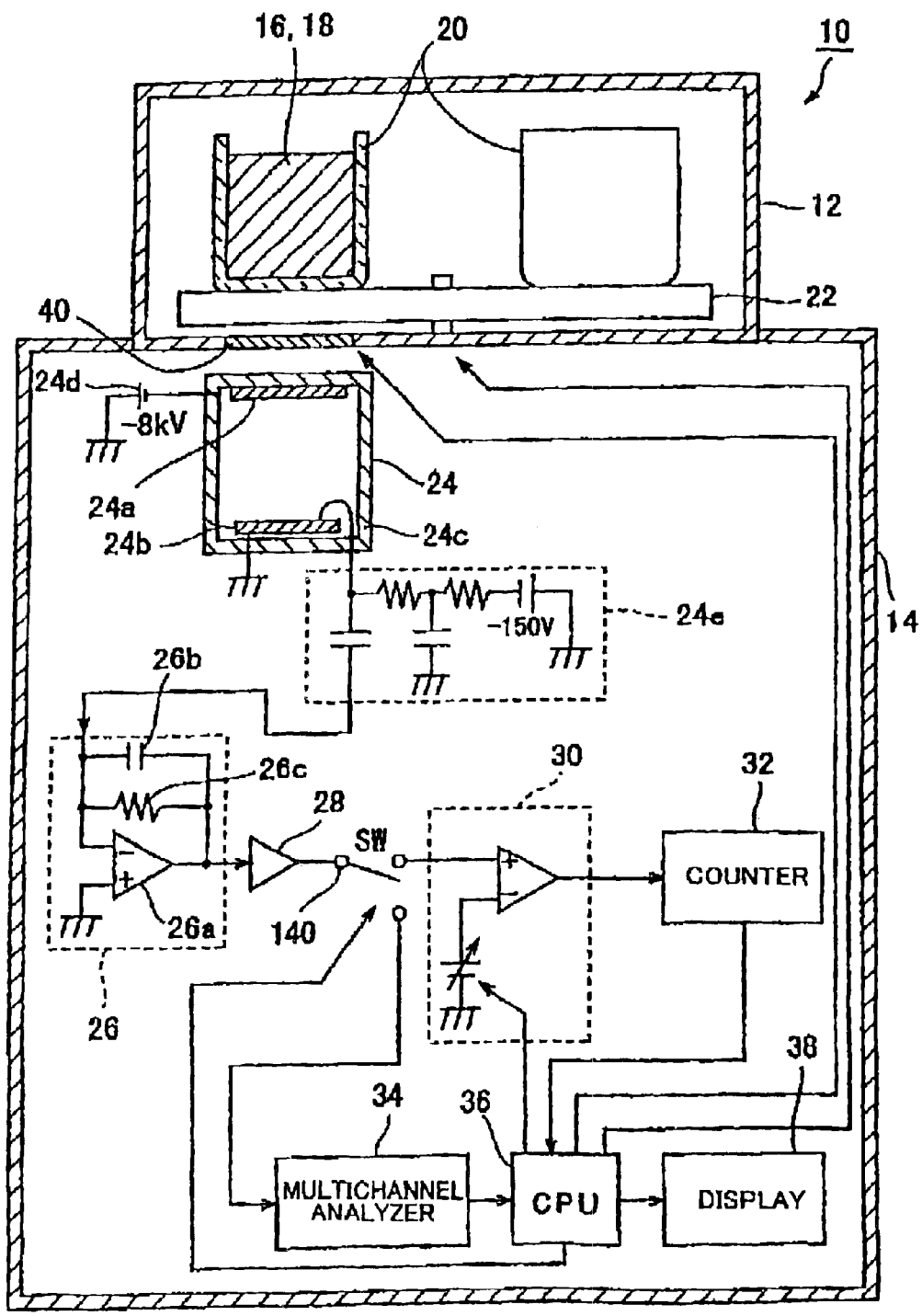
FIG. 1 shows the construction of a liquid scintillation counter serving as an optical measurement apparatus according to a first embodiment of the present invention.

The liquid scintillation counter according to the present embodiment is for detecting the composition and the like of an object to be measured (hereinafter referred to as "sample") by converting β rays emitted from the sample into light by a liquid scintillation and counting the scintillation light (fluorescent light). The optical measurement apparatus of the present embodiment is included in the scintillation counter according to the present embodiment. First, the construction of the liquid scintillation counter according to the present embodiment will be described. FIG. 1 shows the construction of the liquid scintillation counter according to the present embodiment.

The liquid scintillation counter 10 according to the present embodiment includes a sample chamber 12 and a measurement chamber 14. The sample chamber 12 is provided with a plurality of vials 20 in which a sample 16 and a liquid scintillator 18 are introduced, and a rotating base 22 that is rotatably provided for supporting the plurality of vials.

The liquid scintillator 18 can be, for example, a solution of 2,5-diphenyloxazole dissolved in toluene. When β rays are emitted from the sample in this case, fluorescent light having a wavelength of 380 nm is emitted from the liquid scintillator 18. When tritium is used as the sample, this fluorescent light is a pulse light having an average of about 60 photons.

The measurement chamber 14 is provided with a hybrid photodetector (hereinafter referred to as an HPD 24), a charge amplifier 26, a voltage amplifier 28, a comparator 30, a counter 32, a multichannel analyzer 34, a CPU 36, a display 38, and a switch 140. Here, the HPD 24, charge amplifier 26, and voltage amplifier 28 make up the photodetecting unit.

Next, each component in the liquid scintillation counter will be described in greater detail.

The HPD 24 is an electron tube having a photocathode 24a for emitting photoelectrons corresponding to the number of incident photons and an avalanche photodiode (hereinafter referred to as an APD 24b), which is a semiconductor photodetector for outputting a signal corresponding to the number of photoelectrons emitted from the photocathode 24a. The photocathode 24a and APD 24b are disposed opposing each other in a vacuum chamber 24c. A high-voltage source 24d applies a high negative voltage (for example, −8 kV) to the photocathode 24a, while a bias circuit 24e applies a reverse bias voltage (for example, −150 V) across an anode and a cathode of the APD 24b. An electronic lens unit not shown in the diagram is also provided in the HPD 24, enabling the photoelectrons emitted from the photocathode 24a to be efficiently impinged on the APD 24b.

The HPD 24 is positioned such that the photocathode 24a faces the sample chamber 12 in order to receive (a portion of) the fluorescent light emitted from the liquid scintillator 18. More specifically, a shutter 40 is provided in the wall separating the sample chamber 12 and measurement chamber 14 and positioned in opposition to the photocathode 24a. Opening the shutter 40 during measurements allows (a portion of) fluorescent light emitted from the liquid scintillator 18 to fall incident on the photocathode 24a. The light emitted from the liquid scintillator 18 is blocked when not performing measurements by closing the shutter 40.

Figure 2:
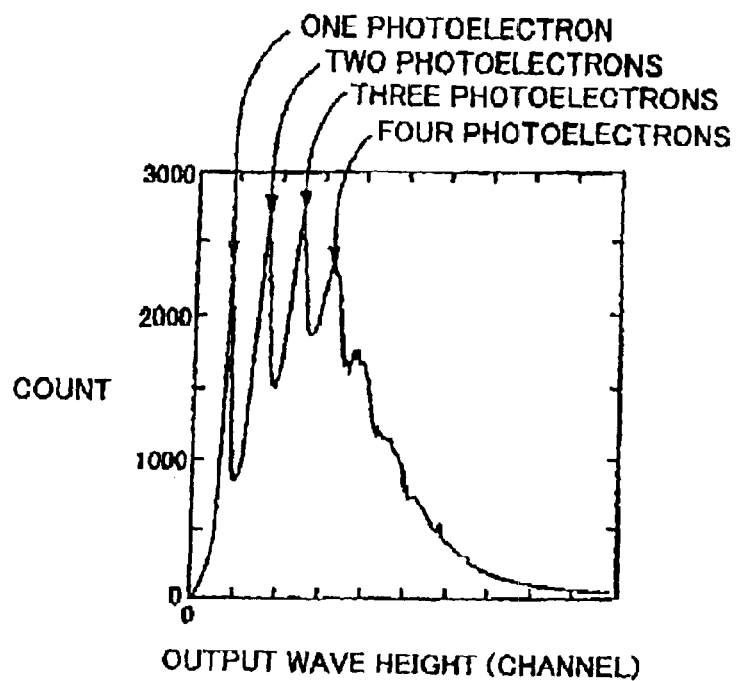
FIG. 2 shows the distribution of wave heights outputted from the HPD 24 in FIG. 1.

When photons impinge on the photocathode 24a, photoelectrons corresponding to the number of the incident photons are emitted from the photocathode 24a. These photoelectrons are accelerated by the work of an electric field, converged by the electronic lens unit, and impinged on the APD 24b. When the photoelectrons enter the APD 24b, numerous hole-electron pairs are generated when they lose energy. This determines the multiplication factor of the first stage. The multiplication factor of the first stage is dependent on the acceleration voltage of the electrons (the voltage applied to the photocathode), and is approximately 1,200 when the voltage is −8 kV. The electrons are further amplified through avalanche multiplication to about 50 times, resulting in a gain of approximately 60,000 times through the effects of the entire APD 24b. Since the multiplication factor of approximately 1,200 in the first stage is extremely large, the multiplication fluctuations in the HPD 24 that uses the APD 24b are extremely small. Accordingly, the distribution of outputted wave heights shown in FIG. 2 are obtained from the HPD 24 when the HPD 24 receives multiple photons. With this HPD 24, it is possible to detect how many photoelectrons are emitted from the photocathode 24a. The results shown in FIG. 2 were obtained when applying a voltage of −8 kV to the photocathode 24a and a reverse bias voltage of −150 V to the APD 24b and conducting measurements using an Oltec model no. 142A preamplifier.

As the HPD 24, the electron tubes disclosed in Japanese unexamined patent application publications Nos. HEI-9-312145 and HEI-6-318447, a photomultiplier tube disclosed in Japanese unexamined patent application publication No. HEI-8-148113, and an electron tube disclosed in Japanese unexamined patent application publication No. HEI-9-297055 can be widely used.

As shown in FIG. 1, the charge amplifier 26 includes an operational amplifier 26a, a capacitor 26b connected to a minus input terminal and an output terminal of the operational amplifier 26a, and a resistor 26c connected in parallel to the capacitor 26b. The signal outputted from the APD 24b is inputted into the minus input terminal of the operational amplifier 26a, while the plus input terminal of the operational amplifier 26a is grounded. The charge amplifier 26 integrates the charge amount received from the HPD 24, and outputs the integrated result as the voltage. For example, if the capacitance of the capacitor 26b is 1 pF and the resistance of the resistor 26c is 1 GΩ, then the charge amplifier 26 outputs an inputted charge amount of 1 pC as a voltage of 1 V. In this case, the time constant of the outputted voltage waveform is 1 ms.

The voltage amplifier 28 amplifies and outputs the voltage received from the charge amplifier 26. The amplifying gain is set to 50 times, for example.

The switch 140 switches, in response to instructions from the CPU 36, an output destination to output the output signal received from the voltage amplifier 28 to either the comparator 30 or the multichannel analyzer 34.

The comparator 30 compares the output signal outputted from the voltage amplifier 28 to a prescribed threshold value and outputs an output signal only when the output signal is greater than the threshold value. More specifically, the output signal received from the voltage amplifier 28 is inputted into the plus input terminal of the comparator 30, while a reference voltage indicative of the threshold value is inputted into the minus input terminal. The threshold value is set larger than an output signal that will be received from the voltage amplifier 28 when a single photoelectron is emitted from the photocathode 24a and smaller than another output signal that will be outputted from the voltage amplifier 28 when two photoelectrons are emitted from the photocathode 24a. Taking into account the gain of the APD 24b (60,000 times), the conversion gain of the charge amplifier (1 V/1 pC), and the gain of the voltage amplifier 28 (50 times), the output signal will be 0.5 V when one photoelectron is emitted and 1.0 V when two photoelectrons are emitted. Hence, the threshold value is set between 0.5 and 1.0 V. It is noted that the CPU 36 determines the threshold value.

The counter 32 counts the pulses outputted from the comparator 30 and outputs the result to the CPU 32. The display 38 displays the counted value determined by the counter 32, and a detected composition and the like of the sample.

The multichannel analyzer 34 measures the distribution of wave heights of output signals outputted from the voltage amplifier 28. That is, each time a pulse output signal is outputted from the voltage amplifier 28, the multichannel analyzer 34 adds and accumulates a prescribed value (such as 1) to a channel (address) corresponding to the wave height (voltage) of the outputted signal pulse. In this way, the multichannel analyzer 34 measures the distribution of wave heights for output signals received from the voltage amplifier 28.

The CPU 36 controls the entire apparatus. More specifically, the CPU 36 controls the switch 140, controls the content displayed on the display 38, determines the threshold value for the comparator 30, controls opening and closing of the shutter 40, and the like. The method for determining the threshold value is described later in more detail. The CPU 36 further controls rotation of the rotating base 22 in the sample chamber 12, moving the vial 20 to be measured to a position corresponding to the HPD 24. The various control processes of the CPU 36 given above will be described with reference to the flowcharts shown in FIGS. 4(a)–4(c). Program data implementing the processes in these flowcharts is stored, for example, in a ROM not shown in the drawings.

Next, the method for determining the threshold value performed by the CPU 36 will be described in more detail. First, the CPU 36 closes the shutter 40 and switches the switch 140 to the multichannel analyzer 34 side. By closing the shutter 40, the CPU 36 creates a state of no incident light on the HPD 24 (hereinafter referred to as a "dark state"). Since photoelectrons are discharged discretely from the photocathode 24a one electron at a time in a dark state, the voltage amplifier 28 outputs in a pulse form output signals of wave heights corresponding to one electron worth. Accordingly, it is possible to determine an output signal that will be outputted from the voltage amplifier 28 when a single photoelectron is emitted from the photocathode 24a by measuring with the multichannel analyzer 34 the distribution of wave heights in a dark state.

Figure 3:
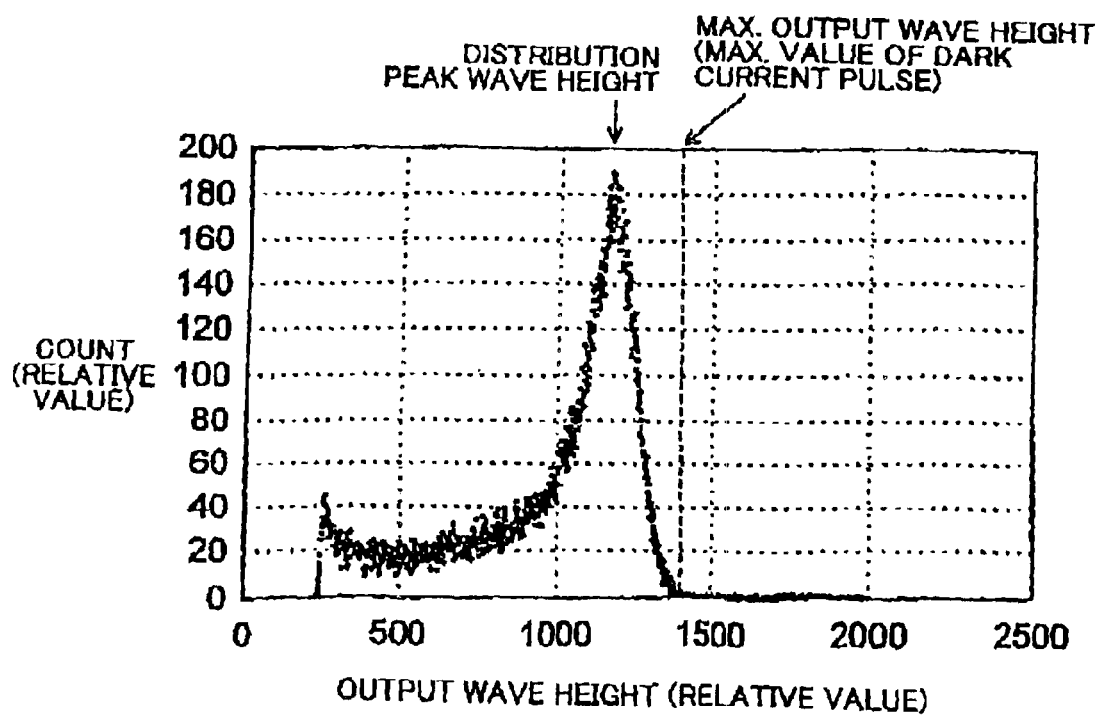
FIG. 3 shows the distribution of wave heights outputted from the HPD 24 in FIG. 1 during a dark state.

In other words, each time a pulse output signal is outputted from the voltage amplifier 28, the multichannel analyzer 34 adds and accumulates a prescribed value (for example, 1) to the channel (address) corresponding to the wave height (voltage) of the output signal pulse. In this way, the multichannel analyzer 34 measures the wave height distribution for signals outputted from the voltage amplifier 28. Hence, the output wave height distribution in a dark state is obtained after a prescribed period of time, as shown in FIG. 3. The horizontal axis in FIG. 3 represents the channel corresponding to the wave height of the output signal pulse outputted from the voltage amplifier 28. In this example, the $1,200^{th}$ channel on the horizontal axis corresponds to a wave height value of 0.56 V of the output signal pulse. The vertical axis represents a relative value for the number of times (count) that an output signal has been obtained for each wave height. Hence, the value of the output wave height, at which the wave height distribution peaks (hereinafter referred to as the "distribution peak wave height"), is equivalent to an average output signal that is outputted from the voltage amplifier 28 when a single photoelectron is emitted from the photocathode 24a. The output signal outputted from the voltage amplifier 28 when two photoelectrons are emitted from the photocathode 24a can be determined by doubling the output signal that is outputted when a single photoelectron is emitted.

The following is a description of how the threshold value is set within a range greater than an output signal that is outputted when a single photoelectron is emitted and smaller than another output signal that is outputted when two photoelectrons are emitted.

Varying the voltage applied to the photocathode 24a and the reverse bias voltage applied to the APD 24b changes the output wave height distribution (FIG. 3) of the output signals outputted from the voltage amplifier 28. This also changes the maximum output wave height, which is the largest value from among the obtained output wave heights; that is, the maximum value of the dark current pulse. The inventors of the present invention varies the voltage applied to the photocathode 24a at −7.5 kV, −8.0 kV, and −8.5 kV; varied the reverse bias voltage of the APD 24b at −148 V, −150 V, and −152 V; and measured the output wave height for a fixed period of time for each case to obtain the maximum value of the acquired output wave heights (that is, the maximum value of the dark current pulse). The results of these measurements are listed in Table 1 below. It is noted that when preparing Table 1, the maximum value of the dark current pulse is converted to the number of photoelectrons. In other words, the maximum output wave height from among the wave height distribution obtained for each measurement is divided by the distribution peak wave height, with the result indicating the maximum value of the dark current pulse.

TABLE 1

|  |  | APD reverse bias voltage (V) | | |
|---|---|---|---|---|
|  |  | −148 | −150 | −152 |
| Photocathode voltage (kV) | −7.5 | 1.26 | 1.26 | 1.29 |
|  | −8.0 | 1.34 | 1.23 | 1.21 |
|  | −8.5 | 1.28 | 1.18 | 1.28 |

According to the results shown in Table 1, the threshold value should be set greater than 1.2 times the output signal that is outputted when a single photoelectron is emitted, but not too large, in order to effectively eliminate the dark current and, moreover, to effectively output another output signal that is outputted when two or more electrons are emitted. That is, it is preferable that the threshold value be set within the range 1.2–1.8 times the output signal that is outputted when a single photoelectron is emitted, and even more preferable within the range 1.3–1.5 times the output signal that is outputted when a single photoelectron is emitted. Therefore, we can see that the CPU 36 should set the threshold value to a single value within the range of 1.2–1.8 times (and more preferably 1.3–1.5 times) the output signal of the voltage amplifier 28 that corresponds to the distribution peak wave height in a dark state.

In the method described above, the distribution peak wave height is determined in a dark state and the threshold value is set within the range 1.2–1.8 times the output signal corresponding to that value. It is noted, however, that the maximum wave height can be determined by measuring, for a prescribed time period, the output wave height distribution in a dark state, as in the experiment described above. Accordingly, the threshold value can also be set to this maximum wave height value or to a value slightly larger than the maximum wave height value.

Next, a description will be given for the operations of the liquid scintillation counter 10 according to the present embodiment, along with a description of a method for scintillation counting according to the present embodiment, while referring to the flowcharts in FIGS. 4(a)–4(c).

Figure 4A:
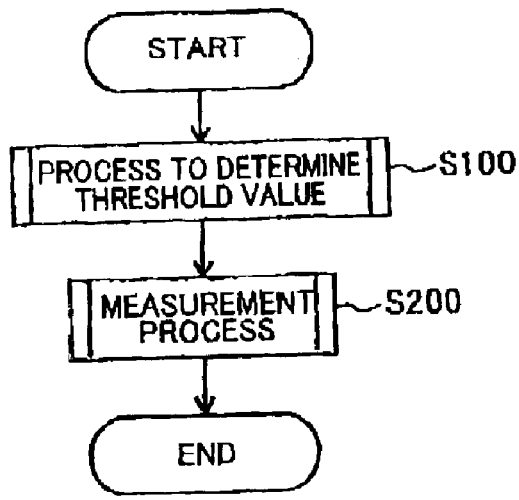
FIG. 4(a) is a flowchart showing the operations of the liquid scintillation counter in FIG. 1.

FIG. 4(a) shows the process for analyzing a sample using the liquid scintillation counter 10 according to the present embodiment. In S100, the CPU determines the threshold value (reference voltage) of the comparator 30. In S200, the sample is actually measured and analyzed. In this way, an accurate measurement can be performed by setting the reference voltage of the comparator 30 each time prior to beginning a measurement because the gain of the HPD 24, the voltage from the power source, and the like change slightly due to the ambient temperature and other operating conditions. However, it is unnecessary to perform the threshold value determining process of S100 each time prior to performing measurements in S200. For example, it is possible to perform this step only when the user deems it necessary.

Figure 4B:
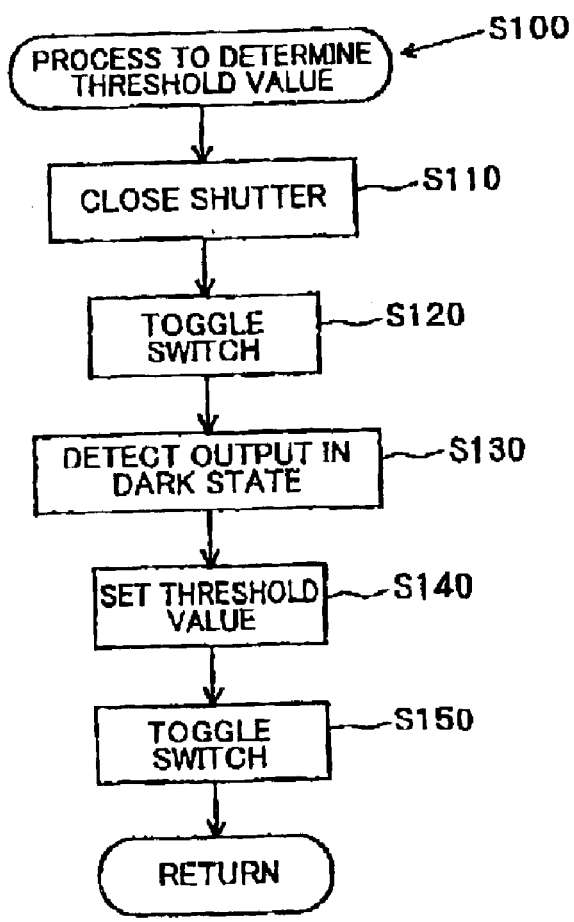
FIG. 4(b) is a flowchart showing the process for setting the threshold value in FIG. 4(a)

The process for determining the threshold value for the comparator 30 (S100) includes the following steps shown in FIG. 4(b).

A high negative voltage (−8 kV) is applied to the photocathode 24a while a reverse bias voltage is applied to the APD 24b. In this state, the shutter 40 is closed in S110 to create a dark state. In S120, the switch 140 is switched to the multichannel analyzer 34 side and the output wave height distribution in the dark state is measured for the prescribed time period.

The output wave height distribution is similar to that shown in FIG. 3. It is possible to see from the distribution peak wave height ($1200^{th}$ channel) that the average output signal outputted from the voltage amplifier 28 when a single photoelectron is emitted from the photocathode 24a is 0.56 V (0.50 V as a calculated value). In S130, the CPU 36 obtains the output wave height distribution data from the multichannel analyzer 34, determines the distribution peak wave height (in this case, the $1200^{th}$ channel), and determines the magnitude of the corresponding output signal from the voltage amplifier 28 (in this case, 0.50 V). In S140, the CPU 36 determines the threshold value to be 0.78 V, for example, equivalent to 1.4 times the magnitude of the output signal (the magnitude of an output signal that is outputted when a single photoelectron is emitted), and sets the reference voltage of the comparator 30 to this threshold value.

After setting the reference voltage in this way (S140), the CPU 36 toggles the switch 140 to the comparator 30 side in S150, and the process for determining the threshold value (S100) ends.

It is noted that the spread in the output signals that are obtained when a single photoelectron is emitted, as seen in FIG. 3, is caused by fluctuation in amplification by the HPD 24 and noise from the charge amplifier 26 and the like. However, since the amplification fluctuation by the HPD 24 is extremely small compared to that by photomultiplier tubes, it is possible to set an appropriate threshold value.

Next, in the measurement process (S200), the sample 16 and liquid scintillator 18 are set in a manner described below.

An example of the sample 16 is the product of an antigen-antibody reaction between a hormone, tumor marker, or other antigen and an antibody marked by tritium, which is the source of the β rays. It this example, a large amount of emitted β rays indicates the existence of a large amount of antigens, enabling the detection of hormonal abnormality, the existence of a tumor, or the like. After the sample 16 is introduced into a vial 20, the vial 20 is filled with the liquid scintillator 18.

Figure 4C:
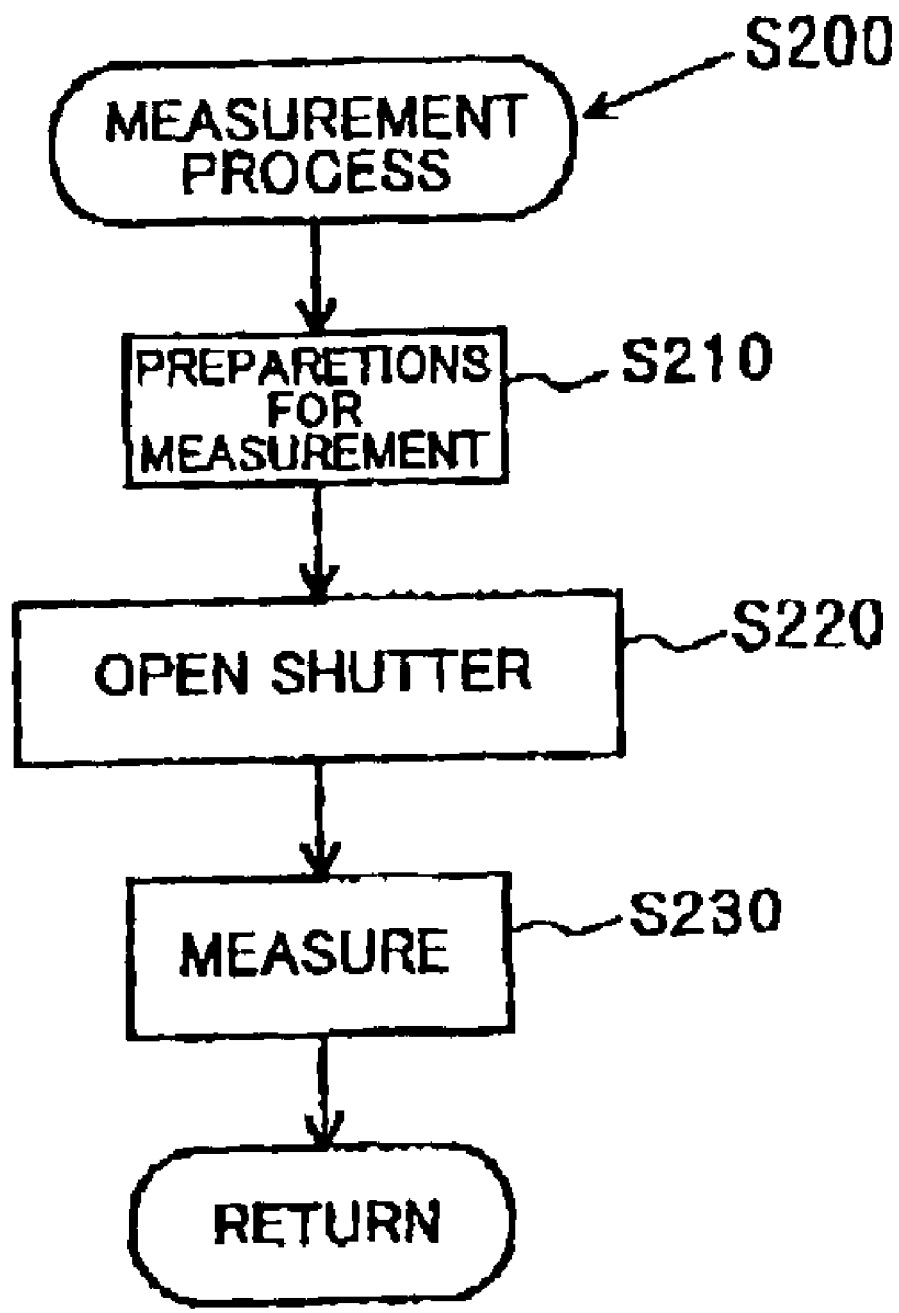
FIG. 4(c) is a flowchart showing the measurement process in FIG. 4(a)

After a sensor or the like not shown in the drawings detects that a vial 10 filled with the sample 16 and liquid scintillator 18 has been placed on the rotating base 22, then the CPU 36 begins in S210 the preliminary process for measurement, as shown in FIG. 4(c). In other words, the CPU 36 rotates the rotating base 22 until the vial 20 reaches the measuring position, that is, a position opposing the HPD 24.

When the vial 20 reaches the measuring position, the CPU 36 opens the shutter 40 in S220 and begins measurements in S230.

In the measuring process (S230), (a portion of) fluorescent light emitted from the liquid scintillator 18 impinges in pulses on the photocathode 24a. When photons impinge on the photocathode 24a, photoelectrons corresponding to the number of impinged photons are emitted from the photocathode 24a. The photoelectrons are accelerated by the effects of an electric field, converged by the effect of the electronic lens unit, and impinged on the APD 24b. The photoelectrons impinged on the APD 24b generate multiple hole-electron pairs when they lose their energy and are further amplified through avalanche multiplication before being outputted.

A pulse charge outputted from the HPD 24 in this way is amplified by the charge amplifier 24 and outputted as a voltage. The voltage, is further amplified by the voltage amplifier 28. The output signal pulse outputted from the voltage amplifier 28 is inputted into the comparator 30. The comparator 30 compares the output signal pulse to a reference voltage and outputs a single logical pulse signal when the wave height of the output signal pulse is higher than the reference voltage. Since the reference voltage for the comparator 30 is met to 0.78 V, which corresponds to 1.4 times the output signal that is outputted when a single photoelectron is emitted, a logic pulse signal is not outputted by the comparator 30 in response to a dark current pulse corresponding to an output signal that is outputted when a single photoelectron is emitted. On the other hand, a logic pulse signal is effectively outputted from the comparator 30 in response to an output signal that is outputted when two or more photoelectrons are emitted. Hence, when an output signal pulse based on two or more photoelectrons is inputted, the comparator 30 outputs a single logic pulse signal indicating one event, regardless of the amount of photoelectrons.

While it is conceivable that there will be cases in which a single photoelectron is emitted due to fluorescent light from the liquid scintillator 18, it is more likely that a plurality of photons will be emitted in one event when performing radiation detection or the like using the liquid scintillator 18. It is not particularly problematic to eliminate, along with the dark current pulses, output signals that are outputted when a single photoelectron is emitted.

The counter 32 counts output signals outputted from the comparator 30. In other words, the counter 32 measures the number of events by counting pulse signals from the comparator 30. This count value is inputted into the CPU 36. Based on this count value, the CPU 36 determines the existence of hormonal abnormalities or tumors and displays the results on the display 38.

As described above, the liquid scintillation counter 10 of the present embodiment includes the HPD 24, charge amplifier 26, voltage amplifier 28, comparator 30, counter 32, multichannel analyzer 34, CPU 36, display 38, and the like. The HPD 24 has the photocathode 24a and APD 24b for outputting signals in response to the number of incident photons. The comparator 30 compares an output signal outputted from the HPD 24 and amplified by the charge amplifier 26 and voltage amplifier 20 with a threshold value. Here, the threshold value is set larger than an output signal that is outputted when a single photoelectron is emitted from the photocathode 24a and smaller than another output signal that is outputted when two photoelectrons are emitted. The comparator 30 outputs a logic pulse signal serving as a comparison result signal only when the output signal is larger than the threshold value.

Next, the operations and effects of the liquid scintillation counter according to the present embodiment will be described. According to the liquid scintillation counter 10 of the present embodiment, the HPD 24 outputs a signal that corresponds to the number of the emitted photoelectrons. Further, the comparator 30 outputs only those output signals, larger than a threshold value equivalent to 1.4 times, an output signal that is outputted when a single photoelectron is emitted. Hence, the liquid scintillation counter can effectively eliminate dark current pulses having an output waveform substantially identical to that of an output signal that is outputted when a single photoelectron is emitted, without eliminating but effectively outputting those output signals that are outputted when two or more photoelectrons are emitted. As a result, high-precision measurements are possible.

Although the frequency in which photoelectrons forming dark current pulses are emitted from the photocathode depends on the size, type, and the like of the photocathode, in general this frequency is several tens to several thousands counts per second. Therefore, these dark current pulses can create much noise when detecting weak light. It becomes necessary to decrease the counting efficiency is order to remove this large noise. To overcome this, the liquid scintillation counter 10 of the present embodiment effectively removes dark current pulses, thereby improving counting efficiency.

Figure 5:
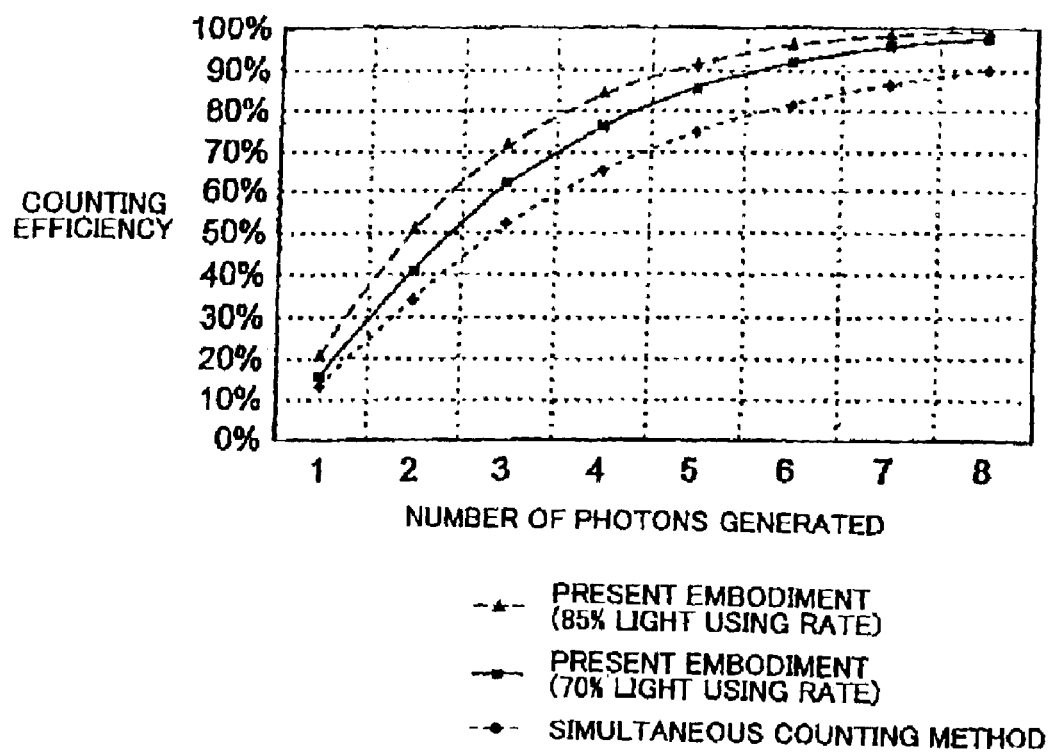
FIG. 5 is a graph comparing the counting efficiencies of the liquid scintillation counter of FIG. 1 with counting efficiency of a comparative example.

For comparison purposes, FIG. 5 shows the counting efficiencies of a conventional liquid scintillation counter employing a simultaneous counting method and of the liquid scintillation counter 10 of the present embodiment. The horizontal axis represents the average number of photons emitted in a single event, while the vertical axis represents the counting efficiency. According to the conventional liquid scintillation counter employing the simultaneous measuring method, the ratio between the numbers of photons impinging on the two photomultiplier tubes is frequently about 3:7. Therefore, the counting efficiency for the optical measurement apparatus according to the simultaneous counting method was set to the percentage, at which light was detected simultaneously by both photomultiplier tubes when light was guided at this ratio into the photomultiplier tubes. In the liquid scintillation counter 10 according to the present embodiment, two counting efficiencies were set to the percentages: a rate, at which two or more photoelectrons were detected when 70% of scintillation light was incident on the HPD 24 (70% light using rate); and another rate, at which two or more photoelectrons were detected when 85% of the scintillation light was incident on the HPD 24 (85% light using rate). For example, when an average of three photons are emitted in a single event, the light using efficiency of the optical measurement apparatus employing the simultaneous counting method is about 51%, while the counting efficiency of the liquid scintillation counter 10 according to the present embodiment is 62% (at 70% light using rate) or 72% (at 85% light using rate). Hence, the light using efficiency of the optical measurement apparatus according to the present embodiment is improved over the optical measurement apparatus using the simultaneous counting method. For simplicity, the quantum efficiency of the photocathode 24a has been set at 100%.

Since the liquid scintillation counter 10 of the present embodiment does not require two photomultiplier tubes, two high-speed processing circuits, simultaneous counting circuits, and the like, this device can be simplified and made more compact than a liquid scintillation counter using the simultaneous counting method. Eliminating the need for simultaneous counting and the like relaxes the necessity for high-speed processing.

By having the ability to set a reference voltage (threshold value) of the comparator 30 via the CPU 36, the liquid scintillation counter 30 of the present embodiment can reset the threshold value to an appropriate value for the working environment. As a result, measurements can be performed with high accuracy, regardless of the operating environment.

The liquid scintillation counter according to the present embodiment measures output signals for a single photoelectron using the multichannel analyzer 34 and sets the threshold value at 1–2 times (more specifically, 1.4 times) this output signal with the comparator 30. Accordingly, it is possible to set an appropriate threshold value even when the output signal that is outputted when a single photoelectron is emitted is previously unknown.

By detecting light with the HPD 24 having the APD 24*b*, the liquid scintillation counter 10 of the present embodiment can effectively differentiate when a single photoelectron is emitted from the photocathode 24*a* and when two or more photoelectrons are emitted. As a result, dark current pulses having an output waveform substantially identical to that whet a single photoelectron is emitted can be removed with extreme effectiveness.

Figure 7:
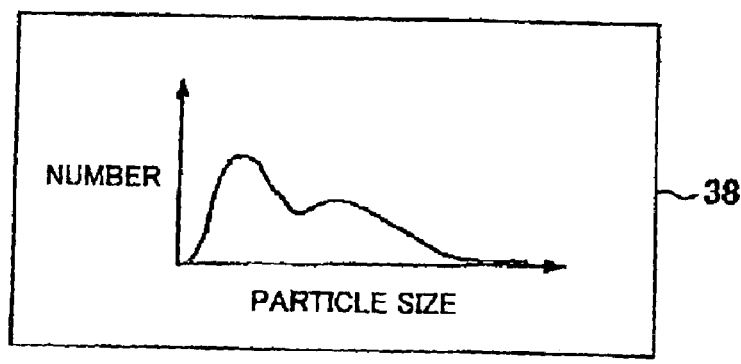
FIG. 7 shows the content displayed by the particle counter of FIG. 6.
Figure 6:
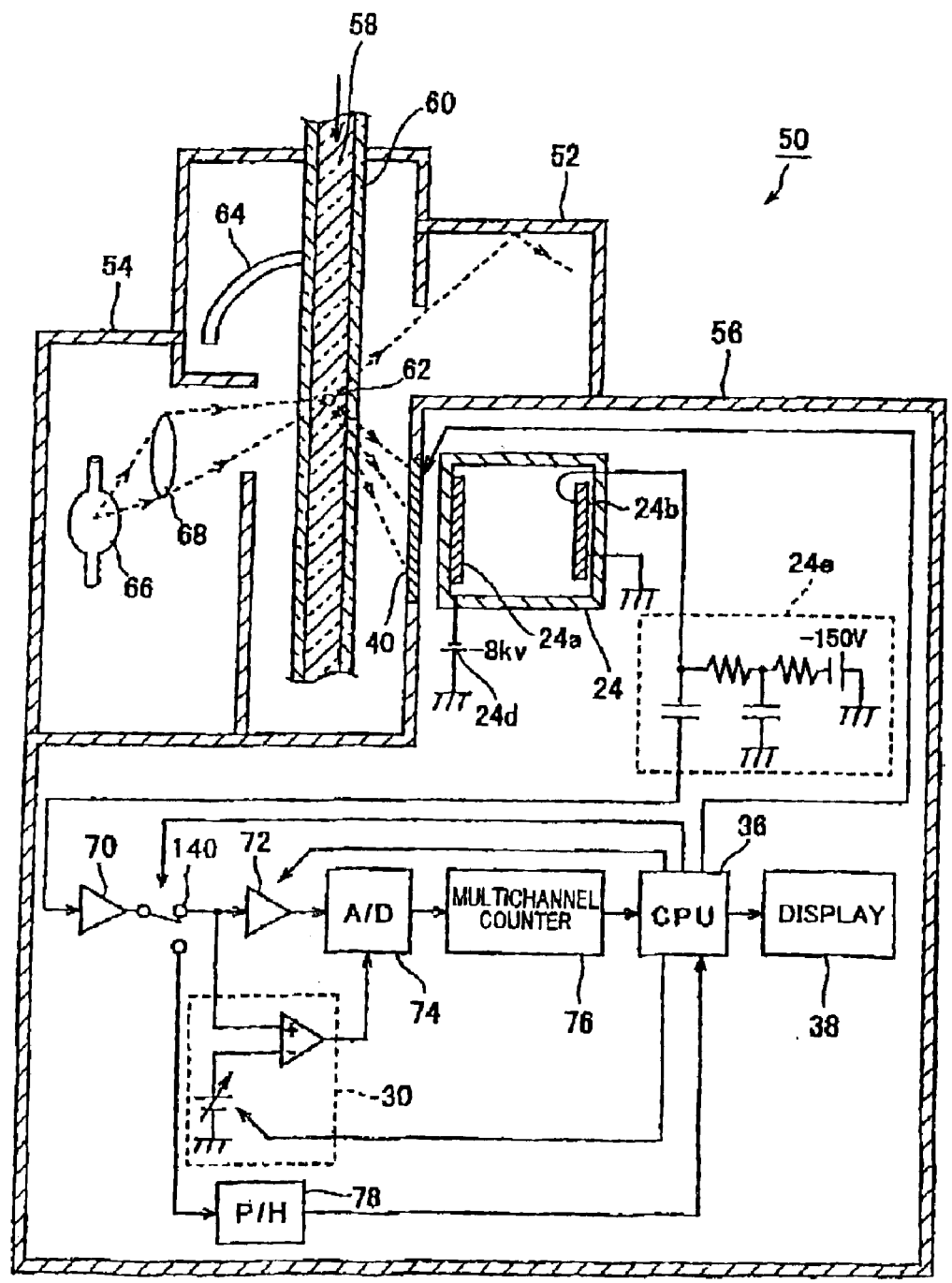
FIG. 6 shows the construction of a particle counter serving as an optical measurement apparatus according to a second embodiment of the present invention.

Next, an optical measurement apparatus according to a second embodiment of the present invention will be described with reference to FIGS. 6 and 7. The optical measurement apparatus according to the present embodiment is a particle counter.

The particle counter according to the present embodiment irradiates light on a sample such as water or air and detects scattered light that has been scattered due to foreign matter mixed in the sample, to thereby measure the particle size, and number of the foreign matter. Parts and components in the particle counter according to the present embodiment that art identical to those of the liquid scintillation counter of the first embodiment are designated by the same reference numerals to avoid duplicating description. First, the construction of the particle counter according to the present embodiment will be described. FIG. 6 shows the construction of the particle counter according to the prevent embodiment.

A particle counter 50 according to the present embodiment includes a sample chamber 52, a light source chamber 54, and a measurement chamber 56. The sample chamber 52 includes a capillary tube 60 in which a sample 58 flows, and a curved mirror 64 for gathering scattered light from foreign matter 62 contained in the sample 58 to fall incident on the measurement chamber 56. The light source chamber 54 includes a light source 66 for emitting light to irradiate the sample 58, and a condensing lens 68 for condensing the light irradiated from the light source 66.

The measurement chamber 56 is provided with the HPD 24, an I/V conversion amplifier 70, a pain regulating amplifier 72, the comparator 30, an A/D (analog-to-digital) converter 74, a multichannel counter 76, a peak holding circuit 78, the CPU 36, the display 38, and the switch 140. Here, the HPD 24 and the I/V conversion amplifier 70 make up the light detecting unit.

The shutter 40 is provided in a wall separating the sample chamber 52 and measurement chamber 56 at a position that confronts the photocathode 24*a* of the HPD 24. By opening the shutter 40 during measurements, (a portion of) scattered light generated by foreign matter in the sample 58 falls incident on the photocathode 24*a*. When not performing measurements, the shutter 40 is closed to block the scattered light.

Next, each component of the particle counter will be described in more detail.

The I/V conversion amplifier 70 converts the electric current outputted from the HPD 24 to a voltage and outputs this voltage. The I/V, conversion amplifier 70 is useful for detecting light that falls incident thereon at a high frequency, due to having a better response than a charge amplifier or the like.

According to instructions from the CPC 36, the switch 140 can switch the output destination for output signals outputted from the I/V conversion amplifier 70 to either the comparator 30 and the like or the peak holding circuit 78.

The comparator 30 compares the signals outputted from the I/V conversion amplifier 70 to a prescribed threshold value and outputs a trigger signal to the A/D converter 74 when the output signal is larger than the threshold value. This threshold value is set larger than an output signal that is outputted from the I/V conversion amplifier 70 when a single photoelectron is emitted from the photocathode 24*a* and smaller than another output signal that is outputted from the I/V conversion amplifier 70 when two photoelectrons are emitted from the photocathode 24*a*.

The A/D converter 74, upon receipt of the trigger signal from the comparator 30, converts the output signal outputted from the I/V conversion amplifier 70 from analog to digital, and outputs the resulting signal to the multichannel counter 76. The resolution of the A/D converter 74 is adjusted in order to output, as a digital value, the number of photoelectrons emitted from the photocathode 24*a*. In other words, the A/D converter 74 outputs a digital value "2" when two photoelectrons are emitted from the photocathode 24*a*, a digital value "3" when three photoelectrons are emitted, and a digital value "4" when four photoelectrons are emitted. However, since the A/D converter 74 performs A/D conversion after receiving a trigger signal from the comparator 30 and since the threshold value of the compactor 30 is set larger than the output signal that is outputted from the I/V conversion amplifier 70 when a single photoelectron is emitted from the photocathode 24*a*, then no signal will be outputted from the A/D converter 74 when a single photoelectron is emitted from the photocathode 24*a*. The gain regulating amplifier 72 adjusts the gain of the A/D converter 74 according to instructions from the CPU 36.

The multichannel counter 76 counts the number of digital signals outputted from the A/D converter 74 for each digital value and outputs the count to the CPU 36. In other wards, each time a digital signal is outputted from the A/D converter 74, the multichannel counter 76 adds and accumulates a prescribed value (for example, 1) at an address corresponding to the digital output value. Through use of the multichannel counter 76, therefore, the distribution of the number of photoelectrons emitted from the photocathode 24*a* (that corresponds to the distribution of the number of incident photons) is obtained.

The peak holding circuit 78 holds the peak value of output signals outputted from the I/V conversion amplifier 70 and outputs this value to the CPU 36. Accordingly, it is possible to measure the maximum value of dark current pulses within a fixed time period by toggling the switch 140 to the peak holding circuit 78 side during a dark state.

Similar to the CPU 36 of the liquid scintillation counter 10 in the first embodiment, the CPU 36 in the present embodiment controls overall operations of the particle counter 50, as shown in the flowcharts of FIGS 4(*a*–4*c*).

Next, the operations of the particle counter according to the present embodiment will be described together with a method for counting particles according to the present embodiment.

In order to analyze the sample 60 using the particle counter 50 of the present embodiment, as in the first embodiment, the threshold value of the comparator 30 is determined in S100 (see FIG. 4(*a*)). The steps in the process for determining the threshold value are described below with reference to FIG. 4(*b*). That is, in S110, the shutter 40 is closed to form a dark state. In S120, the switch 140 is toggled to the peak holding circuit 76 side. In S130, the dark current pulses are measured for the fixed time period. In S140, the CPU 36 receives the output value from the peak holding circuit 78, that is, the maximum value of the output signals from the I/V conversion amplifier 70 within the set time period (the wave height of the maximum output shown in FIG. 3) and sets the threshold value to this maximum value.

After setting the threshold value in S140, the CPU 36 toggles the switch 140 to the comparator 30 side (S150) and begins the measurement process of S200.

In the measurement process of S200, as shown in FIG. 4(c), preparations for; measurements are performed in S210. That is, the sample 58, such as water or the like, is started being introduced into the capillary tube 60. The switch of the light source 66 is turned on to begin irradiating light on the sample 58. In S220, the shutter 40 is opened. When the sample 56 contains no foreign matter 62, then light irradiated from the light source 66 passes through the capillary tube 60 and the sample 58 and does not fall incident on the HPD 24. However, when the sample 58 contains foreign matter 62, then light irradiated from the light source 66 is scattered by the foreign matter 62 and a portion of the light falls incident on the HPD 24.

When light fells incident on the HPD 24, photoelectrons are emitted from the photocathode 24a. These photoelectrons are multiplied and outputted by the APD 24b. The output current is converted to a voltage by the I/V conversion amplifier 70 and converted from analog to digital by the A/D converter 74. Subsequently, the multichannel counter 76 counts the digital value. Since the reference voltage of the comparator 30 is set to the maximum value of the dark current pulse (equivalent to 1.3–1.5 times an output signal that is outputted when a single photoelectron is emitted), the dark current pulses equivalent to the output signal that is outputted when a single photoelectron is emitted are not converted from analog to digital and accordingly are not outputted from the A/D converter 74. However, output signals that are outputted when two or more photoelectrons are emitted are converted from analog to digital and effectively outputted from the A/D converter 74.

Signals outputted from the A/D converter 74 are taunted for each output value by the multichannel counter 76. The distribution of the number of photoelectrons (equivalent to the distribution of the number of incident photons) is obtained and outputted to the CPU 36. Since the number of incident photons is dependent on the particle site of the foreign matter 62, the CPU 36 calculates the distribution of particle sizes of the foreign matter 62 based an the distribution of the number of incident photons and displays the distribution in the display 38, as shown in FIG. 7.

Next, the operations and effects of the particle counter according to the present embodiment will be described. According to the particle counter 50 of the present embodiment, the HPD 24 outputs an output signal that corresponds to the number of generated photoelectrons. The A/D converter 74 outputs a signal when a trigger signal is received from the comparator 30. Accordingly, it is possible to effectively remove the dark current pulses having an output waveform substantially identical to that of an output signal that is outputted when a single photoelectron is emitted, while output signals that are outputted when two or more photoelectrons are emitted are not eliminated and can be effectively outputted, thereby making it possible to perform measurements with high precision.

If a GaAs photocathode is used in the particle counter to increase quantum efficiency and the surface area of the photocathode is enlarged to increase light using efficiency, then the frequency, in which photoelectrons forming a dark currant pulse are emitted from the photocathode, becomes several tens of thousands counts per second. If it takes about 1 μs to perform A/D conversion, then the time for measuring the dark current pulse will take up about 10of the overall time, greatly increasing the likelihood that scattered light to be measured will go uncounted. Contrarily, the particle counter 50 of the present embodiment does not perform A/D conversion on dark current pulses but only on output signals due to scattered light (signal light), enabling more efficient measurements with high precision. Therefore, the particle counter 50 of the present embodiment can accurately detect the number and particle size of foreign matter (dust and other contaminants) contained in the air or pure water in clean room designed for manufacturing semiconductor equipment, for example, and is extremely useful for controlling these environments.

Since the particle counter 50 of the present embodiment does not require two photomultiplier tubes, two nigh-speed processing circuits, simultaneous counting circuits, and the like, this device can be simplified and made more compact than a particle counter using the simultaneous counting method. Eliminating the need for simultaneous counting and the like relaxes the necessity for high-speed processing.

By having the ability to set a reference voltage (threshold value) of the comparator 30 via the CPU 36, the particle counter 50 of the present embodiment can reset the threshold value to an appropriate value for the working environment. As a result, measurements can be performed with high accuracy, regardless of the operating environment.

The particle counter 50 of the present embodiment measures the maximum value of dark current pulses within a fixed time period using the peak holding circuit 78 and sets the threshold value to this maximum value, thereby enabling the threshold value to be set to an appropriate value even when the magnitude of the dark current pulse is not known in advance.

By detecting light with the HPD 24 having the APD 24b, the particle counter 50 of the present embodiment can effectively differentiate when a single photoelectron is emitted from the photocathode 24a and when two or more photoelectrons are emitted. As a result, dark current pulses having an output waveform substantially identical to that of an output signal that is outputted when a single photoelectron is emitted can be removed with extreme effectiveness.

The optical measurement apparatus and method for optical measurement of the present invention are not limited to the embodiments described above. Many modifications and variations may be made therein.

For example, while the liquid scintillation counter 10 and the particle counter 50 according to the first and second embodiments employ the APD 24b as the semiconductor light detector, a photodiode or the like can also be used.

Further, the CPU 36 in the liquid scintillation counter 10 and the particle counter 50 of the first and second embodiments performs the process to determine a threshold value in S100 in order to determine and set the threshold value. However, the threshold value can also be set manually using a control knob or the like. A portion of the process to determine the threshold value of S100, for example, the step for closing the shutter 40 (S110), the steps for switching the switch 140 (S120, S150), or the like can be performed manually. Similarly, a portion of steps in the measurement process of S200, such as the measurement preparation step (S210), the step to open the switch 140 (S220), or the like can also be performed manually. Further, while the liquid scintillator 18 is used in the first embodiment described above, a solid scintillator may also be used.

Further, the above first and second embodiments are related to scintillation counting using the liquid scintillation counter 10 and particle counting using the particle counter 50. However, the optical measurement apparatus and method for optical measurement of the present invention are not limited to these processes. For example, the present invention can measure various light by controlling the measurement chamber 14 of the liquid scintillation counter 10 or the measurement chamber 56 of the particle counter 50 to measure a desired light.

In the liquid scintillation counter 10 of the first embodiment described above, the comparator 30 outputs a logic pulse signal as a comparison result signal when the output signal from the voltage amplifier 28 is larger than the reference voltage. However, the comparator 30 may output the output signal pulse from the voltage amplifier 26 itself instead.

INDUSTRIAL APPLICABILITY

The optical measurement apparatus and method for optical measurement according to the present invention can be used for measuring pulse light with good accuracy and can be used in a wide range of applications, including the medical field, environment monitoring, environment control in a clean room, and optical communications.

What is claimed is:

1. An optical measurement apparatus comprising:
   a photodetecting portion emitting photoelectrons that correspond to the amount of light in an incident light beam and outputting an output signal that corresponds to the number of the photoelectrons;
   a comparing portion comparing the output signal with a predetermined threshold value and outputting a comparison result signal when the output signal is greater than the threshold value, the comparing portion outputting no comparison result signal when the output signal is not greater than the threshold value; and
   a measuring portion performing measurement in accordance with the comparison result signal,
   wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons,
   whereby the measuring portion performs measurement when the photodetecting portion emits two or more photoelectrons, the measuring portion failing to perform measurement when the photodetecting portion emits only one photoelectron.

2. An optical measurement apparatus as claimed in claim 1, further comprising a setting portion setting the threshold value.

3. An optical measurement apparatus as claimed in claim 2, wherein the setting portion measures an output signal that the photodetecting portion outputs when the photodetecting portion outputs a single photoelectron, the setting portion setting the threshold value within a range of the amount of the output signal and two times the amount of the output signal.

4. An optical measurement apparatus as claimed in claim 2, wherein the setting portion measures, for a fixed period of time, output signals that the photodetecting portion outputs when the photodetecting portion detects no beam of light in a dark state, the setting portion setting the threshold value to a maximum value of the output signals measured during the fixed period of time.

5. An optical measurement apparatus as claimed in claim 1, wherein the threshold value has a value within a range of 1.2 to 1.8 times an output signal that the photodetecting portion outputs when the photodetecting portion emits a single photoelectron.

6. An optical measurement apparatus as claimed in claim 1, wherein the threshold value has a value within a range of 1.3 to 1.5 times an output signal that the photodetecting portion outputs when the photodetecting portion emits a single photoelectron.

7. An optical measurement apparatus as claimed in claim 1, wherein the photodetecting portion includes:
   a photocathode emitting photoelectrons that correspond to the amount of light in the incident light beam;
   an accelerating portion accelerating the photoelectrons emitted from the photocathode; and
   a semiconductor photodetector receiving the photoelectrons accelerated by the accelerating portion and outputting a signal that corresponds to the number of the photoelectrons.

8. An optical measurement apparatus as claimed in claim 7, wherein the semiconductor photodetector includes an avalanche photodiode.

9. An optical measurement apparatus as claimed in claim 1, wherein the comparing portion judges, each time the comparing portion receives a single output signal, whether or not the value of the output signal exceeds the threshold value, the comparing portion outputting a single pulse signal when the comparing portion determines that the output signal exceeds the threshold value, thereby indicating detection of a single event, in which two or more photoelectrons have been emitted;
   wherein the measuring portion includes a counter counting the number of the pulse signals outputted from the comparing portion.

10. An optical measurement apparatus as claimed in claim 1, wherein the measuring portion includes an analog-to-digital converting portion executing an analog-to-digital conversion to convert the output signal supplied from the photodetecting portion from analog to digital,
    wherein the comparing portion outputs a trigger signal for triggering the analog-digital converting portion to convert the output signal from analog to digital when the output signal exceeds the threshold value.

11. An optical measurement apparatus as claimed in claim 2, wherein the setting portion includes:
    a shutter selectively blocking a light beam from falling incident on the photodetecting portion, thereby selectively putting the photodetecting portion in a dark state;
    a dark state measuring portion measuring output signals that the photodetecting portion outputs in the dark state;
    a switch disposed between the photodetecting portion and the comparing portion and the dark state measuring portion, the switch selectively supplying the output signals from the photodetecting portion to a selected one of the comparing portion and the dark state measuring portion; and
    a threshold value determination controlling portion controlling the shutter to place the photodetecting portion in the dark state, controlling the switch to supply the output signals from the photodetecting portion to the dark state measuring portion, thereby causing the dark state measuring portion to measure the output signals from the photodetecting portion in the dark state, the threshold value determination controlling portion determining the threshold value based an the results of the dark-state measurement.

12. An optical measurement apparatus as claimed in claim 11, wherein the dark state measuring portion includes a wave height analyzer measuring a wave height distribution of the output signals received from the photodetecting portion, the threshold value determination controlling portion determining the threshold value based on a wave height indicative of a peak in the wave height distribution of the output signals.

13. An optical measurement apparatus as claimed in claim 11, wherein the dark state measuring portion includes a peak detector detecting a peak value of the output signals received from the photodetecting portion, the threshold value determination controlling portion determining the threshold value based on the peak value of the output signals.

14. An optical measurement apparatus as claimed in claim 1, further comprising a scintillator converting beta rays emitted from an object of measurement into fluorescent light,
wherein the photodetecting portion receives the fluorescent light, and emits photoelectrons that correspond to the amount of the fluorescent light, thereby outputting the output signal, and
wherein the comparing portion compares the output signal with the predetermined threshold value and outputs a comparison result signal when the output signal is greater than the threshold value, the comparing portion outputting no comparison result signal when the output signal is not greater than the threshold value, the measuring portion counting the fluorescent light in accordance with the comparison result signal.

15. An optical measurement apparatus as claimed in claim 1, further comprising a scattered light generating portion generating scattered light by scattering light according to particles mixed in a sample to be measured,
wherein the photodetecting portion receives the scattered light, and emits photoelectrons that correspond to the amount of the scattered light, thereby outputting the output signal, and
wherein the comparing portion compares the output signal with the predetermined threshold value and outputs a comparison result signal when the output signal is greater than the threshold value, the comparing portion outputting no comparison result signal when the output signal is not greater than the threshold value, the measuring portion counting the particles in accordance with the comparison result signal.

16. A scintillation counter, comprising:
a scintillator converting beta rays emitted from an object of measurement into fluorescent light;
a photodetecting portion receiving the fluorescent light, and emitting photoelectrons that correspond to the amount of the fluorescent light, thereby outputting an output signal that corresponds to the number of the photoelectrons;
a comparing portion comparing the output signal with a predetermined threshold value and outputting a comparison result signal when the output signal is greater than the threshold value, the comparing portion outputting no comparison result signal when the output signal is not greater than the threshold value; and
a measuring portion counting the fluorescent light in accordance with the comparison result signal,
wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons,
whereby the measuring portion performs counting when the photodetecting portion emits two or more photoelectrons, the measuring portion failing to perform counting when the photodetecting portion emits only one photoelectron.

17. A particle counter, comprising
a scattered light generating portion generating scattered light by scattering light according to particles mixed in a sample to be measured;
a photodetecting portion receiving the scattered light, and emitting photoelectrons that correspond to the amount of the scattered light, thereby outputting an output signal that corresponds to the number of the photoelectrons;
a comparing portion comparing the output signal with a predetermined threshold value and outputting a comparison result signal when the output signal is greater than the threshold value, the comparing portion outputting no comparison result signal when the output signal is not greater than the threshold value; and
a measuring portion counting the particles in accordance with the comparison result signal,
wherein the threshold value is larger than an output signal that the photodetecting portion outputs when the photodetecting portion emits only one photoelectron, the threshold value being smaller than another output signal that the photodetecting portion outputs when the photodetecting portion emits two photoelectrons,
whereby the measuring portion performs counting when the photodetecting portion emits two or more photoelectrons, the measuring portion failing to perform counting when the photodetecting portion emits only one photoelectron.

18. An optical measurement method comprising:
a photodetecting step emitting photoelectrons that correspond to the amount of light in an incident light beam and outputting an output signal that corresponds to the number of the photoelectrons;
a comparing step comparing the output signal with a predetermined threshold value and outputting a comparison result signal when the output signal is greater than the threshold value, the comparing step outputting no comparison result signal when the output signal is not greater than the threshold value; and
a measuring step performing measurement in accordance with the comparison result signal,
wherein the threshold value is larger than an output signal that the photodetecting step outputs when the photodetecting step emits only one photoelectron, the threshold value being smaller than another output signal that the photodetecting step outputs when the photodetecting step emits two photoelectrons,
whereby the measuring step performs measurement when the photodetecting zing step emits two or more photoelectrons, the measuring step failing to perform measurement when the photodetecting step emits only one photoelectron.

19. An optical measurement method as claimed in claim 18, farther comprising a setting step setting the threshold value.

20. An optical measurement method as claimed in claim 19, wherein the setting step measures an output signal that the photodetecting step outputs when the photodetecting step outputs a single photoelectron, the setting step setting the threshold value within a range of the amount of the output signal and two times the amount of the output signal.

21. An optical measurement method as claimed in claim 19, wherein the setting step measures, for a fixed period of time, output signals that the photodetecting step outputs when the photodetecting step detects to beam of light in a dark state, the setting step setting the threshold value to a maximum value of the output signals measured during the fixed period of time.

22. An optical measurement method as claimed in claim 18, wherein the threshold value has a value within a range of 1.2 to 1.8 times an output signal that the photodetecting step outputs when the photodetecting step emits a single photoelectron.

23. An optical measurement method as claimed in claim 22, wherein the threshold value has a value within a range of 1.3 to 1.5 times an output signal that the photodetecting step outputs when the photodetecting step emits a single photoelectron.

24. An optical measurement method as claimed in claim 18, wherein the comparing step judges, each time the comparing step receives a single output signal, whether or not the value of the output signal exceeds the threshold value, the comparing step outputting a single pulse signal when the comparing step determines that the output signal exceeds the threshold value, thereby indicating detection of a single event, in which two or more photoelectrons have been emitted;

wherein the measuring step includes a counting step courting the number of the pulse signals outputted from the comparing step.

25. An optical measurement method as claimed in claim 18, wherein the measuring step includes an analog-to-digital converting step executing an analog-to-digital conversion to convert the output signal supplied from the photodetecting step from analog to digital, wherein the comparing step outputs a trigger signal for triggering the analog-digital converting step to convert the output signal from analog to digital when the output signal exceeds the threshold value.

26. An optical measurement method as claimed in claim 18, further comprising a fluorescent converting step using a scintillator to convert beta rays emitted from an object of measurement into fluorescent light, wherein the photodetecting step receives the fluorescent light, and emits photoelectrons that correspond to the amount of the fluorescent light, thereby outputting the output signal, and wherein the comparing step compares the output signal with the predetermined threshold value and outputs a comparison result signal when the output signal is greater than the threshold value, the comparing step outputting no comparison result signal when the output signal is not greater than the threshold value, the measuring step counting the fluorescent light is accordance with the comparison result signal.

27. An optical measurement method as claimed in claim 18, further comprising a scattered light generating step generating scattered light by scattering light according to particles mixed in a sample to be measured, wherein the photodetecting step receives the scattered light, and emits photoelectrons that correspond to the amount of the scattered light, thereby outputting the output signal, and wherein the comparing step compares the output signal with the predetermined threshold value and outputs a comparison result signal when the output signal is greater than the threshold value, the comparing step outputting no comparison result signal when the output signal is not greater than the threshold value, the measuring step counting the particles in accordance with the comparison result signal.

28. A scintillation counting method, comprising:

a fluorescent converting step using a scintillator to convert beta rays emitted from an object of measurement into fluorescent light;

a photodetecting step receiving the fluorescent light, and emitting photoelectrons that correspond to the amount of the fluorescent light, thereby outputting an output signal that corresponds to the number of the photoelectrons;

a comparing step comparing the output signal with a predetermined threshold value and outputting a comparison result signal when the output signal is greater than the threshold value, the comparing step outputting no comparison result signal when the output signal is not greater than the threshold value; and a measuring step counting the fluorescent light in accordance with the comparison result signal, wherein the threshold value is larger than an output signal that the photodetecting step outputs when the photodetecting step emits only one photoelectron, the threshold value being smaller than another output signal that the photodetecting step outputs when the photodetecting step emits two photoelectrons, whereby the measuring step performs counting when the photodetecting step emits two or more photoelectrons, the measuring step failing to perform counting when the photodetecting step emits only one photoelectron.

29. A particle counting method, comprising:

a scattered light generating step generating scattered light by scattering light according to particles mixed in a sample to be measured;

a photodetecting step receiving the scattered light, and emitting photoelectrons that correspond to the amount of the scattered light, thereby outputting an output signal that corresponds to the number of the photoelectrons, a comparing step comparing the output signal with a predetermined threshold value and outputting a comparison result signal when the output signal is greater than the threshold value, the comparing step outputting no comparison result signal when the output signal is not greater than the threshold value; and a measuring step counting the particles in accordance with the comparison result signal, wherein the threshold value is larger than an output signal that the photodetecting step outputs when the photodetecting step emits only one photoelectron, the threshold value being smaller than another signal that the photodetecting step outputs when the photodetecting step emits two photoelectron, whereby the measuring step performs counting when the photodetecting step emits two or more photoelectrons, the measuring step failing to perform counting when the photodetecting step emits only one photoelectron.

* * * * *

UNITED STATES PATENT AND TRADEMARK OFFICE
CERTIFICATE OF CORRECTION

PATENT NO. : 6,960,771 B1 Page 1 of 1
DATED : November 1, 2005
INVENTOR(S) : Motohiro Suyama et al.

It is certified that error appears in the above-identified patent and that said Letters Patent is hereby corrected as shown below:

Title page,
Item [30], Foreign Application Priority Data, should be deleted in its entirety.

Signed and Sealed this

Twenty-third Day of May, 2006

JON W. DUDAS
*Director of the United States Patent and Trademark Office*